United States Patent
Chen et al.

(10) Patent No.: US 12,107,565 B2
(45) Date of Patent: Oct. 1, 2024

(54) FILTER INTEGRATED CIRCUIT

(71) Applicant: RichWave Technology Corp., Taipei (TW)

(72) Inventors: Shih Hsuan Chen, Taipei (TW); Ji-Fuh Liang, Taipei (TW)

(73) Assignee: RichWave Technology Corp., Taipei (TW)

( * ) Notice: Subject to any disclaimer, the term of this patent is extended or adjusted under 35 U.S.C. 154(b) by 367 days.

(21) Appl. No.: 17/521,860

(22) Filed: Nov. 9, 2021

(65) Prior Publication Data

US 2023/0064909 A1    Mar. 2, 2023

(30) Foreign Application Priority Data

Aug. 27, 2021 (TW) .................................. 110131941

(51) Int. Cl.
*H03H 9/54* (2006.01)
*H03H 7/38* (2006.01)
(Continued)

(52) U.S. Cl.
CPC .............. *H03H 9/542* (2013.01); *H03H 7/38* (2013.01); *H03H 9/125* (2013.01); *H03H 9/17* (2013.01)

(58) Field of Classification Search
CPC .......... H03H 9/542; H03H 7/38; H03H 9/125; H03H 9/17; H03H 9/0547; H03H 9/568;
(Continued)

(56) References Cited

U.S. PATENT DOCUMENTS

| 10,326,489 B2 | 6/2019 | Kitajima |
| 10,361,676 B2 | 7/2019 | Yusuf |

(Continued)

FOREIGN PATENT DOCUMENTS

| CN | 109787582 | 5/2019 |
| CN | 109167128 | 1/2021 |
| TW | 200525911 | 8/2005 |

OTHER PUBLICATIONS

Perez-Nicoli et al. Inductive Links for Wireless Power Transfer: Fundamental Concepts for Designing High-Efficiency Wireless Power Transfer Links. Chapter 3. Cham, Switzerland: Springer, Jul. 10, 2021 (Year: 2021).*

(Continued)

*Primary Examiner* — Lincoln D Donovan
*Assistant Examiner* — Tyler J Pereny
(74) *Attorney, Agent, or Firm* — JCIPRNET

(57) ABSTRACT

A filter integrated circuit, including an acoustic wave filter chip and a matching circuit, is provided. The acoustic wave filter chip is covered upon a substrate. The matching circuit is disposed on the substrate to provide matching impedance to the acoustic wave filter chip. A first pad and a second pad of the matching circuit are respectively connected to a first signal terminal and a second signal terminal of the acoustic wave filter chip. First terminals of a first coil inductor and a second coil inductor of the matching circuit are respectively connected to the first pad and the second pad of the substrate. The first coil inductor is adjacent to the second coil inductor, so that mutual inductance and parasitic capacitance are formed, so that the matching circuit and the acoustic wave filter chip jointly generate a transmission zero point located in a triple fundamental frequency range.

18 Claims, 8 Drawing Sheets

(51) Int. Cl.
*H03H 9/125* (2006.01)
*H03H 9/17* (2006.01)

(58) Field of Classification Search
CPC ...... H03H 9/605; H03H 9/6483; H03H 9/706; H03H 3/02; H03H 9/0557; H03H 9/02015; H03H 9/175; H03H 9/564; H03H 7/075; H03H 9/02102; H03H 9/02834; H03H 9/54; H03H 9/725; H03H 7/463; H03H 9/547; H03H 9/6493; H03H 7/0115; H03H 9/1007; H03H 9/02228; H03H 7/1783
See application file for complete search history.

(56) References Cited

U.S. PATENT DOCUMENTS

| | | | |
|---|---|---|---|
| 2013/0141185 A1* | 6/2013 | Tsutsumi | H03H 9/584 333/195 |
| 2015/0078464 A1* | 3/2015 | Kaunisto | H03H 7/0115 333/175 |
| 2017/0244381 A1* | 8/2017 | Lee | H03H 9/173 |
| 2020/0204159 A1* | 6/2020 | Onodera | H03H 9/25 |
| 2021/0194456 A1* | 6/2021 | Luo | H03H 3/02 |

OTHER PUBLICATIONS

Office Action of Taiwan Counterpart Application, issued on Feb. 17, 2022, pp. 1-3.

* cited by examiner

FILTER INTEGRATED CIRCUIT

CROSS-REFERENCE TO RELATED APPLICATION

This application claims the priority benefit of Taiwan application serial no. 110131941, filed on Aug. 27, 2021. The entirety of the above-mentioned patent application is hereby incorporated by reference herein and made a part of this specification.

BACKGROUND

Technical Field

The disclosure relates to an integrated circuit, and particularly relates to a filter integrated circuit.

Description of Related Art

Electronic filters have been widely applied to various electronic circuits. A filter is a circuit, element, or device that may execute a signal processing function and may attenuate undesired composition in a signal and/or enhance desired composition. Among a wide variety of filters, acoustic wave filters, such as surface acoustic wave (SAW) filters and bulk acoustic wave (BAW) filters, are widely applied to communication circuits. As the Fifth-generation (5G) mobile communication bandwidth becomes more high frequency, the market share of the acoustic wave filters increases.

SUMMARY

The disclosure provides a filter integrated circuit, so that a matching circuit and an acoustic wave filter chip can jointly generate a transmission zero point located in a triple fundamental frequency range of an input signal.

In an embodiment of the disclosure, the filter integrated circuit is configured to filter an input signal and then output an output signal. The filter integrated circuit includes an acoustic wave filter chip and a matching circuit. The acoustic wave filter chip is covered upon a substrate to suppress signals outside a frequency band. A first signal terminal and a second signal terminal of the acoustic wave filter chip are respectively configured to input the input signal or output the output signal. The matching circuit is disposed on the substrate to provide matching impedance to the acoustic wave filter chip. The matching circuit includes a first pad, a second pad, a first coil inductor, and a second coil inductor that are configured on the substrate. The first pad is configured to electrically connect to the first signal terminal of the acoustic wave filter chip. The second pad is configured to electrically connect to the second signal terminal of the acoustic wave filter chip. A first terminal of the first coil inductor is electrically connected to the first pad of the substrate. A first terminal of the second coil inductor is electrically connected to the second pad of the substrate. The first coil inductor is adjacent to the second coil inductor, so that mutual inductance and parasitic capacitance are formed, so as to jointly generate a transmission zero point located in a triple fundamental frequency range of the acoustic wave filter chip.

Based on the above, the matching circuit according to the embodiments of the disclosure can provide the matching impedance to the acoustic wave filter chip. In the matching circuit, the first coil inductor is adjacent to the second coil inductor, so that the mutual inductance and the parasitic capacitance are formed. Based on this, the first coil inductor, the second coil inductor, and the acoustic wave filter chip may jointly generate the transmission zero point located in the triple fundamental frequency range of the input signal of the acoustic wave filter chip.

In order for the features and advantages of the disclosure to be more comprehensible, the following specific embodiments are described in detail in conjunction with the accompanying drawings.

DETAILED DESCRIPTION OF DISCLOSED EMBODIMENTS

Figure 1:
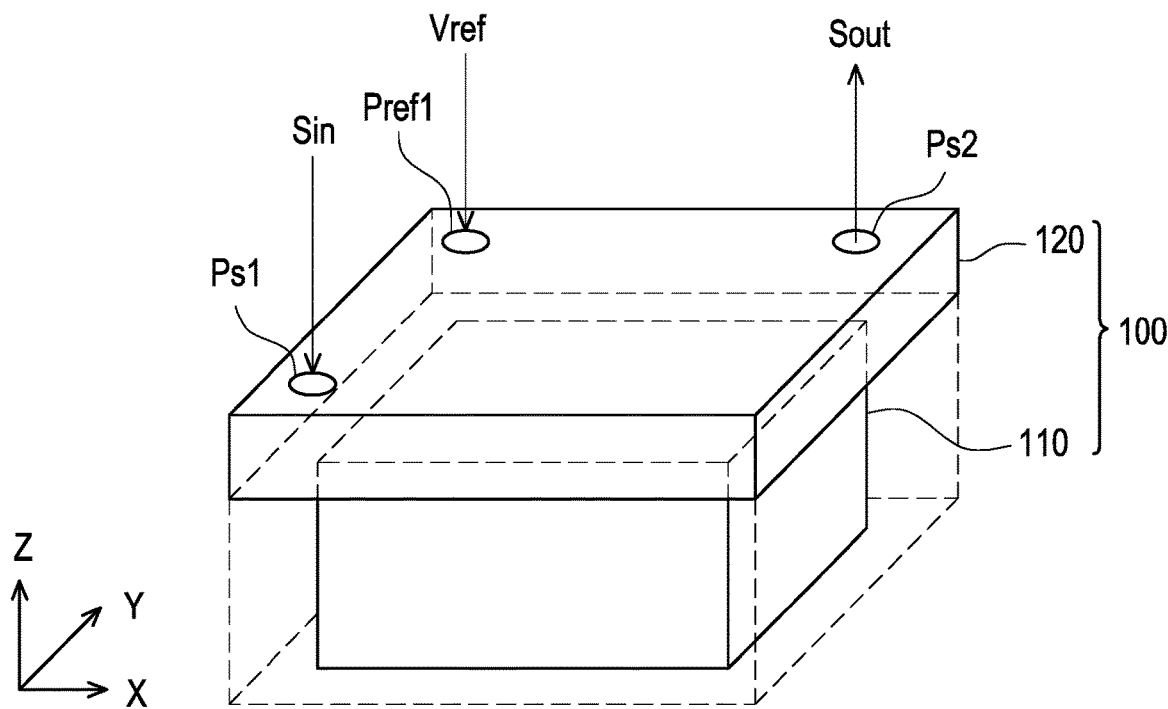
FIG. 1 is a three-dimensional perspective schematic view of a filter integrated circuit according to an embodiment of the disclosure.

The term "coupling (or connection)" used in the entire specification (including the claims) of the disclosure may refer to any direct or indirect connection means. For example, if it is described in the text that a first device is coupled (or connected) to a second device, it should be interpreted as that the first device may be directly connected to the second device or the first device may be indirectly connected to the second device through other devices or a certain connection means. Terms such as "first" and "second" mentioned in the entire specification (including the claims) of the disclosure are used to name elements or distinguish different embodiments or ranges and are not used to limit the upper limit or the lower limit of the number of the elements nor limit the sequence of the elements. In addition, wherever possible, elements/components/steps with the same reference numerals in the drawings and embodiments represent the same or similar parts. For elements/components/steps that use the same reference numerals or use the same terms in different embodiments, cross-reference may be made to related descriptions.

FIG. 1 is a three-dimensional perspective schematic view of a filter integrated circuit 100 according to an embodiment of the disclosure. FIG. 1 shows an X-axis, a Y-axis, and a Z-axis. The filter integrated circuit 100 is configured with a pad Ps1 and a pad Ps2. The pad Ps1 and the pad Ps2 are adapted to be electrically connected to a printed circuit board (PCB, not shown). The pad Ps1 may be configured to receive an input signal Sin, and the pad Ps2 may be configured to send an output signal Sout. The pads Ps1 and Ps2 may also be interchanged. The filter integrated circuit 100 may filter the input signal Sin with a baseband in a certain frequency band and then output the output signal Sout. The filter integrated circuit 100 is also configured with at least one pad Pref1 adapted to be electrically connected to the printed circuit board. The number of the pad Pref1 may be determined according to actual design. The pad Pref1 is configured to receive a reference voltage Vref. The reference voltage Vref may be determined according to actual design. For example, in some embodiments, the reference voltage Vref may be a ground voltage or other fixed voltages.

In the embodiment shown in FIG. 1, the filter integrated circuit 100 includes an acoustic wave filter chip 110 and a substrate 120. A matching circuit (not shown in FIG. 1, but will be described in detail later) is disposed in the substrate 120 to provide matching impedance to the acoustic wave filter chip 110. The acoustic wave filter chip 110 is accommodated in the package of the filter integrated circuit 100, and the substrate 120 may be the package substrate of the filter integrated circuit 100. The acoustic wave filter chip 110 is covered upon the substrate 120. The acoustic wave filter chip 110 may suppress signals outside the certain frequency band. Although not shown in FIG. 1, the acoustic wave filter chip 110 has a first signal terminal and a second signal terminal, which are respectively configured to input/receive the input signal Sin or output the output signal Sout. That is, the first signal terminal of the acoustic wave filter chip 110 may be electrically connected to one of the pad Ps1 and the pad Ps2 through the substrate 120, and the second signal terminal of the acoustic wave filter chip 110 may be electrically connected to the other one of the pad Ps1 and the pad Ps2 through the substrate 120.

The embodiment does not limit the specific implementation of the acoustic wave filter chip 110. For example, according to actual design, the acoustic wave filter chip 110 may include a bulk acoustic wave (BAW) filter chip, a surface acoustic wave (SAW) filter chip, and/or other filters. Compared with the SAW filter chip, the BAW filter chip is suitable for higher bandwidths, and the application of the BAW filter chip to the embodiment does not require additional configuration of some external elements. The following description will be using the BAW filter chip as an example of the specific implementation of the sound wave filter chip 110.

The acoustic wave filter chip 110 may include multiple first film bulk acoustic resonators (FBAR) and multiple second film bulk acoustic resonators. The embodiment does not limit the specific implementation of the film bulk acoustic resonators. For example, according to actual design, any one of the film bulk acoustic resonators may include a conventional film bulk acoustic resonator and/or other film bulk acoustic resonators. The first film bulk acoustic resonators are connected in series between the first signal terminal and the second signal terminal (not shown in FIG. 1) of the acoustic wave filter chip 110. A first terminal of each of the second film bulk acoustic resonators is electrically connected to a corresponding one of the first film bulk acoustic resonators to form a π-type circuit structure. A second terminal of each of the second film bulk acoustic resonators is electrically connected to a corresponding one of multiple reference voltage terminals (not shown in FIG. 1) of the acoustic wave filter chip 110 to receive the reference voltage Vref. That is, the reference voltage terminals of the acoustic wave filter chip 110 may be electrically connected to the pad Pref1 through the substrate 120. The number of the first film bulk acoustic resonators of the acoustic wave filter chip 110 and the number of the second film bulk acoustic resonators may be determined according to actual design.

Figure 2:
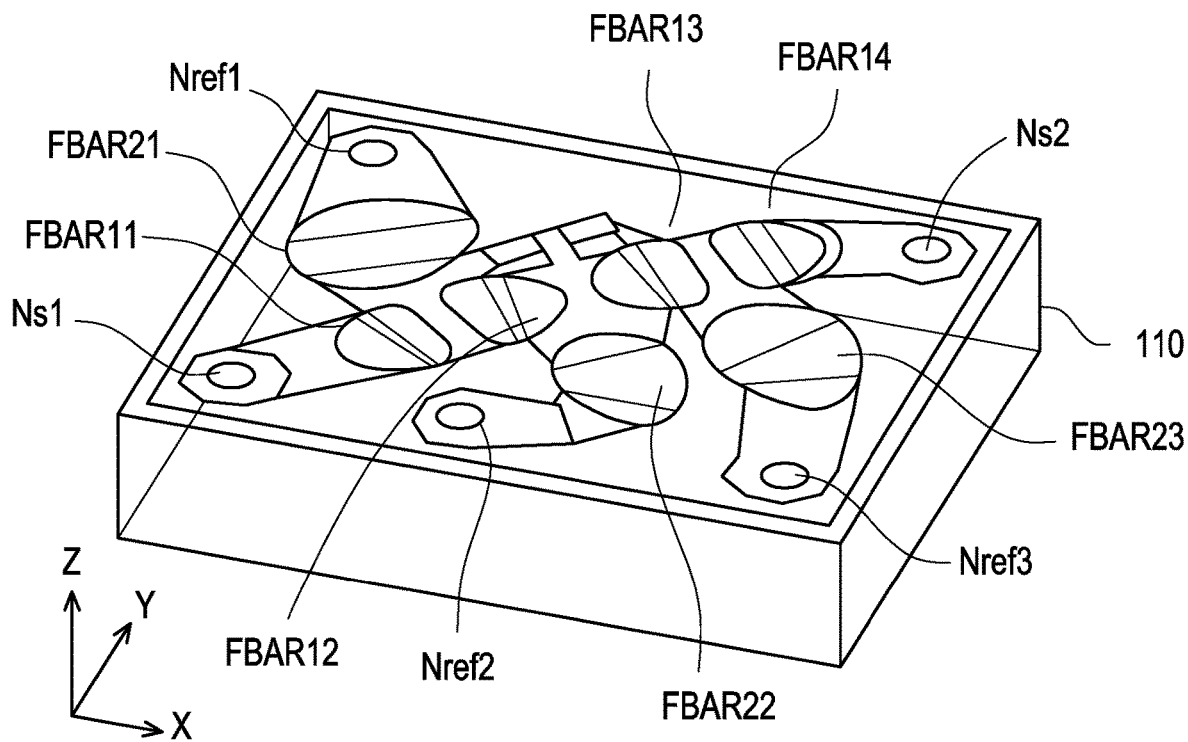
FIG. 2 is a three-dimensional schematic view of a bulk acoustic wave (BAW) filter chip according to an embodiment of the disclosure.
Figure 3:
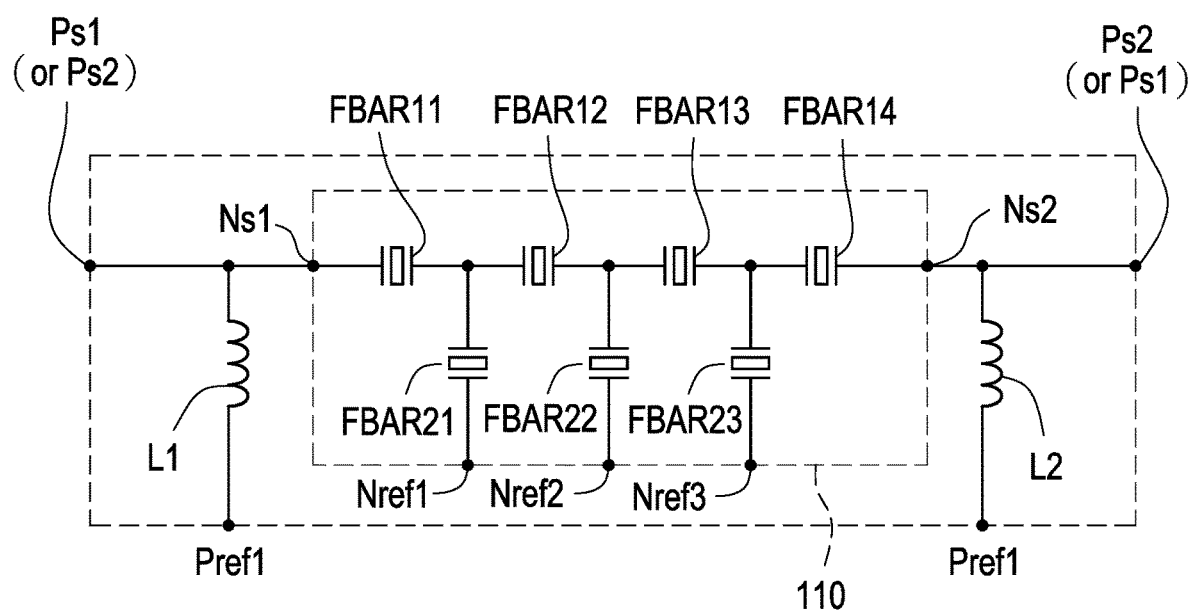
FIG. 3 is a schematic view of an equivalent circuit of the BAW filter chip shown in FIG. 2 according to an embodiment of the disclosure.

For example, FIG. 2 is a three-dimensional schematic view of the acoustic wave filter chip 110 shown in FIG. 1 according to an embodiment of the disclosure. The embodiment shown in FIG. 2 uses the BAW filter chip as an example of the specific implementation of the acoustic wave filter chip 110. For an X-axis, a Y-axis, and a Z-axis shown in FIG. 2, reference may be made to the X-axis, the Y-axis, and the Z-axis shown in FIG. 1. FIG. 3 is a schematic view of an equivalent circuit of the acoustic wave filter chip 110 shown in FIG. 2 according to an embodiment of the disclosure. Please refer to FIG. 2 and FIG. 3. The acoustic wave filter chip 110 may suppress signals outside a rated frequency band. One of a first signal terminal Ns1 and a second signal terminal Ns2 of the acoustic wave filter chip 110 may input the input signal Sin, and the other one of the first signal terminal Ns1 and the second signal terminal Ns2 may output the output signal Sout.

In the embodiment shown in FIG. 2 and FIG. 3, the acoustic wave filter chip 110 may include multiple first film bulk acoustic resonators (for example, film bulk acoustic resonators FBAR11, FBAR12, FBAR13, and FBAR14) and multiple second film bulk acoustic resonators (for example, film bulk acoustic resonators FBAR21, FBAR22, and FBAR23). According to actual design, any one of the film bulk acoustic resonators FBAR11 to FBAR14 and FBAR21 to FBAR23 shown in FIG. 2 and FIG. 3 may be a conventional film bulk acoustic resonator and/or other film bulk acoustic resonators. It should be noted that the film bulk acoustic resonators FBAR11 to FBAR14 and FBAR21 to FBAR23 shown in FIG. 2 and FIG. 3 are one specific example of many implementations of the acoustic wave filter chip 110. In any case, the implementation of the acoustic wave filter chip 110 should not be limited to the embodiment shown in FIG. 2 and FIG. 3.

In the embodiment shown in FIG. 2 and FIG. 3, the thin film bulk acoustic resonators FBAR11 to FBAR14 are connected in series between the first signal terminal Ns1 and the second signal terminal Ns2 of the acoustic wave filter chip 110. The first signal terminal Ns1 may be electrically connected to one of the pad Ps1 and the pad Ps2 through the substrate 120, and the second signal terminal Ns2 may be electrically connected to the other one of the pad Ps1 and the pad Ps2 through the substrate 120. A first terminal of each of the film bulk acoustic resonators FBAR21 to FBAR23 is electrically connected to a corresponding one of the film bulk acoustic resonators FBAR11 to FBAR14 to form a π-type circuit structure (as shown in FIG. 3). A second terminal of each of the film bulk acoustic resonators FBAR21 to FBAR23 is electrically connected to a corresponding one of reference voltage terminals (for example, reference voltage terminals Nref1, Nref2, and Nref3 shown in FIG. 2 and FIG. 3) of the acoustic wave filter chip 110. The reference voltage terminals Nref1 to Nref3 of the acoustic wave filter chip 110 may be electrically connected to the pad Pref1 through the substrate 120 to receive the reference voltage Vref.

Figure 4:
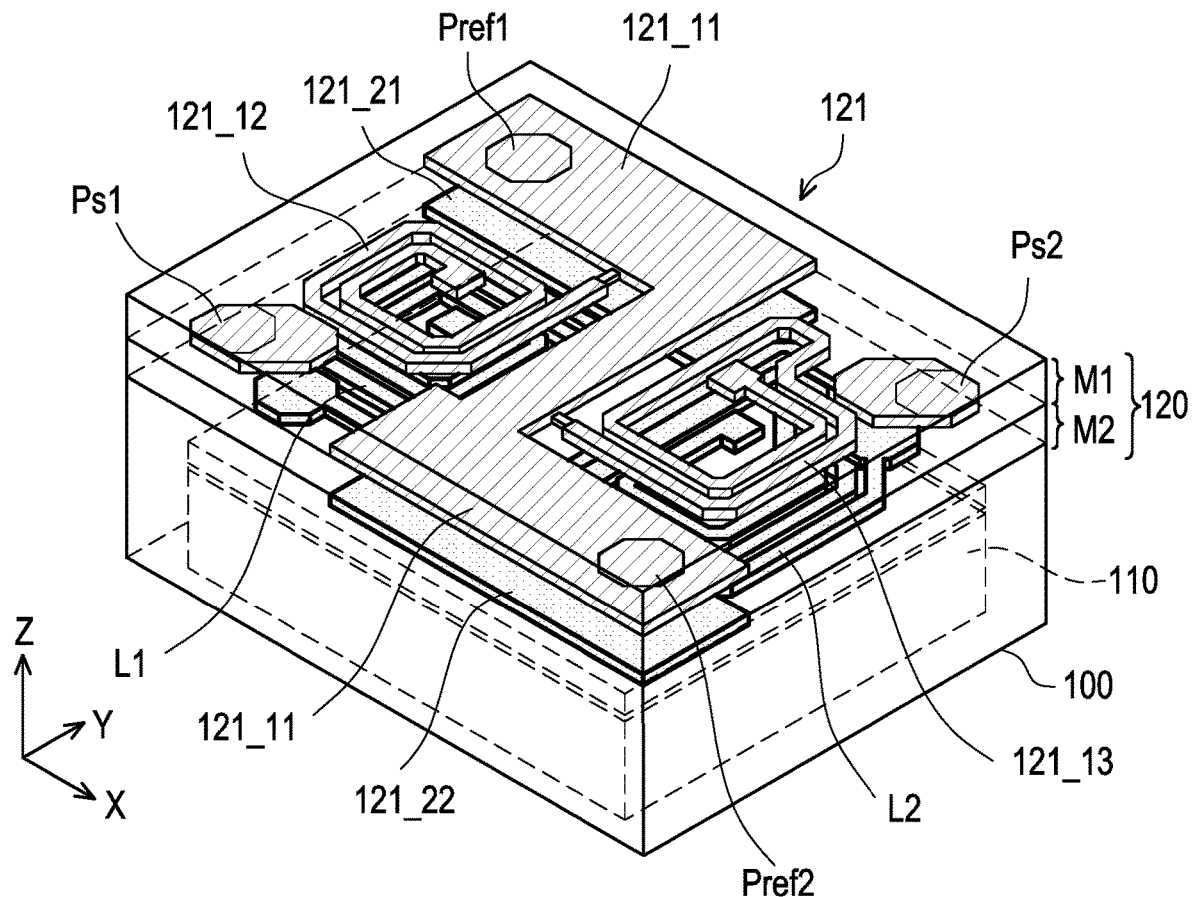
FIG. 4 is a three-dimensional perspective schematic view of a substrate shown in FIG. 1 according to an embodiment of the disclosure.

FIG. 4 is a three-dimensional perspective schematic view of the substrate 120 shown in FIG. 1 according to an embodiment of the disclosure. For an X-axis, a Y-axis, and a Z-axis shown in FIG. 4, reference may be made to the X-axis, the Y-axis, and the Z-axis shown in FIG. 1. The substrate 120 shown in FIG. 4 includes a first conductive layer M1 and a second conductive layer M2. Please refer to FIG. 1, FIG. 3, and FIG. 4. The second conductive layer M2 is disposed between the first conductive layer M1 and the acoustic wave filter chip 110. It should be noted that the first conductive layer M1 and the second conductive layer M2 shown in FIG. 4 are one specific example of many implementations of the substrate 120. In any case, the implementation of the substrate 120 should not be limited to the embodiment shown in FIG. 4. According to actual design, in some embodiments, the substrate 120 includes three (or more) conductive layers. In other embodiments, the substrate 120 may only have the second conductive layer M2.

In the embodiment shown in FIG. 4, a matching circuit 121 is disposed on the first conductive layer M1 and the second conductive layer M2 of the substrate 120. The matching circuit 121 may provide matching impedance to the acoustic wave filter chip 110. The pad Ps1 and pad Ps2 are disposed on the first conductive layer M1 of the substrate 120. The pad Ps1 is electrically connected to one of the first signal terminal Ns1 and the second signal terminal Ns2 of the acoustic wave filter chip 110, and the pad Ps2 is electrically connected to the other one of the first signal terminal Ns1 and the second signal terminal Ns2 of the acoustic wave filter chip 110. For example, the pad Ps1 may be electrically connected to the first signal terminal Ns1 of the acoustic wave filter chip 110 through a conductive via (not shown), and the pad Ps2 may be electrically connected to the second signal terminal Ns2 of the acoustic wave filter chip 110 through a conductive via (not shown).

The matching circuit 121 includes the pad Ps1, the pad Ps2, the pad Pref1, a coil inductor L1, and a coil inductor L2. The coil inductor L1 and the coil inductor L2 will be described later with reference to FIG. 3 and FIG. 6. Although not shown in FIG. 1, in the embodiment shown in FIG. 4, the matching circuit 121 may also include a pad Pref2. The pad Pref2 is configured to receive the reference voltage Vref. In the embodiment shown in FIG. 4, the coil inductor L1 and the coil inductor L2 are disposed on the second conductive layer M2 of the substrate 120. A first terminal of the coil inductor L1 is electrically connected to the pad Ps1 of the substrate 120 through a conductive via (not shown). A first terminal of the coil inductor L2 is electrically connected to the pad Ps2 of the substrate 120 through a conductive via (not shown). The coil inductor L1 is adjacent to the coil inductor L2, so that mutual inductance and parasitic capacitance are formed, so as to jointly generate a transmission zero point located in a triple fundamental frequency range of the input signal Sin with the acoustic wave filter chip 110, especially the transmission zero point located at a double frequency and/or a triple frequency, to suppress the double frequency (that is, a second harmonic) and/or the triple frequency (that is, a third harmonic) in the input signal Sin.

Figure 5:
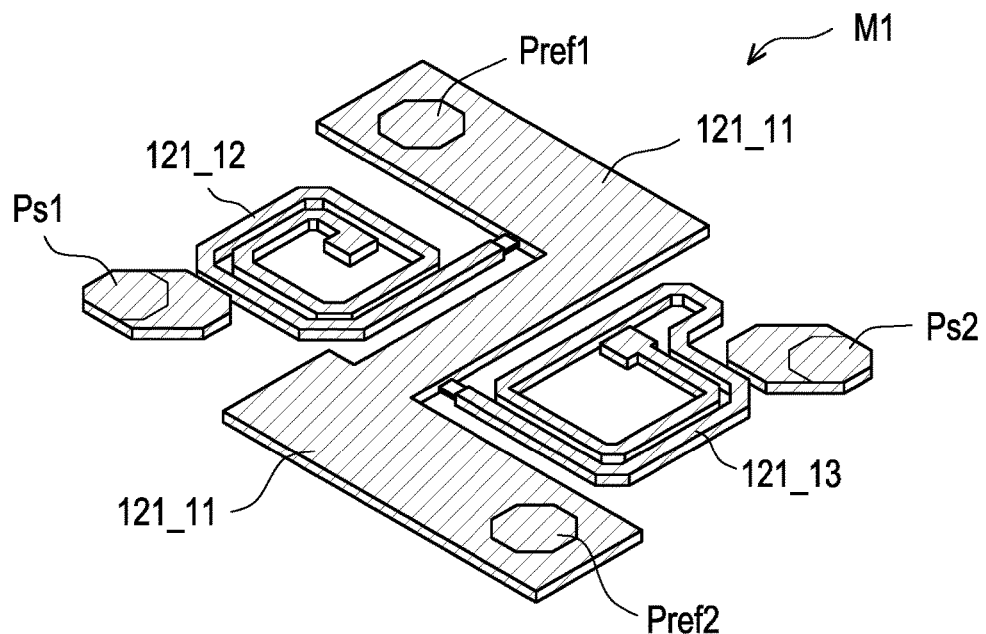
FIG. 5 is a schematic view of a layout structure of a first conductive layer shown in FIG. 4 according to an embodiment of the disclosure.
Figure 6:
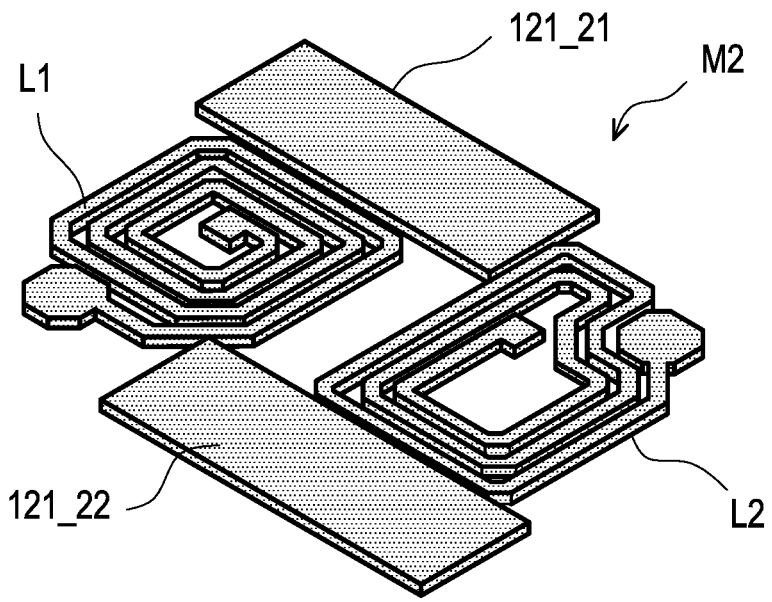
FIG. 6 is a schematic view of a layout structure of a second conductive layer shown in FIG. 4 according to an embodiment of the disclosure.

FIG. 5 is a schematic view of a layout structure of the first conductive layer M1 shown in FIG. 4 according to an embodiment of the disclosure. FIG. 6 is a schematic view of a layout structure of the second conductive layer M2 shown in FIG. 4 according to an embodiment of the disclosure.

Please refer to FIG. 3, FIG. 4, FIG. 5, and FIG. 6. A reference voltage transmission element 121_21, a reference voltage transmission element 121_22, the coil inductor L1, and the coil inductor L2 of the matching circuit 121 are configured on the second conductive layer M2. A reference voltage transmission element 121_11, an adjustment coil 121_12, and an adjustment coil 121_13 of the matching circuit 121 are configured on the first conductive layer M1.

The reference voltage transmission element 121_11 on the first conductive layer M1 is electrically connected to the pad Pref1 and the pad Pref2. The reference voltage transmission element 121_11 is also electrically connected to the reference voltage transmission elements 121_21 and 121_22 on the second conductive layer M2 through conductive vias (not shown). The reference voltage transmission elements 121_21 and 121_22 are electrically connected to the reference voltage terminals Nref1 to Nref3 of the acoustic wave filter chip 110. Therefore, the reference voltage Vref may be transmitted to the reference voltage terminals Nref1 to Nref3 of the acoustic wave filter chip 110 through the pad Pref1, the pad Pref2, the reference voltage transmission element 121_11, and conductive vias (not shown).

The first terminal of the coil inductor L1 may be electrically connected to the pad Ps1 and the first signal terminal Ns1 of the acoustic wave filter chip 110 through a conductive via (not shown). The adjustment coil 121_12 is disposed corresponding to the coil inductor L1. For example, in a Z-direction on an XY plane where the coil inductor L1 is located, a projection of the adjustment coil 121_12 and the coil inductor L1 both have a similar appearance and close position. In an embodiment, the two may have coil appearances with opposite or the same winding directions and have close centroid positions. A first terminal of the adjustment coil 121_12 may be electrically connected to a second terminal of the coil inductor L1 through a conductive via (not shown). A second terminal of the adjustment coil 121_12 is electrically connected to the reference voltage transmission element 121_11. The number of turns of the adjustment coil 121_12 is less than the number of turns of the coil inductor L1. The first terminal of the coil inductor L2 may be electrically connected to the pad Ps2 and the second signal terminal Ns2 of the acoustic wave filter chip 110 through a conductive via (not shown). The adjustment coil 121_13 is disposed corresponding to the coil inductor L2. For example, in the Z-direction on the XY plane where the coil inductor L2 is located, a projection of the adjustment coil 121_13 and the coil inductor L2 both have similar appearances and close positions. In an embodiment, the two may have opposite winding directions or the same coil appearances, and have close centroid positions. The first terminal of the adjustment coil 121_13 may be electrically connected to the second terminal of the coil inductor L2 through a conductive via (not shown). The second terminal of the adjustment coil 121_13 is electrically connected to the reference voltage transmission element 121_11. The number of turns of the adjustment coil 121_13 is less than the number of turns of the coil inductor L2.

In the embodiment shown in FIG. 6, the coil inductor L1 includes a spiral-shaped first conductive line, and the coil inductor L2 includes a spiral-shaped second conductive line. The first conductive line has a first line width, and the second conductive line has a second line width. The shortest distance between the coil inductor L1 and the coil inductor L2 is less than 4 times the first line width (or the second line width). The first conductive line located on the outermost side of the coil inductor L1 and the second conductive line located on the outermost side of the coil inductor L2 are parallel to each other. The coil inductor L1 is adjacent to the coil inductor L2, so that mutual inductance and parasitic capacitance are formed, so as to jointly generate the transmission zero point located in the triple fundamental frequency range of the input signal Sin with the acoustic wave filter chip 110, especially the transmission zero point located at the double frequency and/or the triple frequency, to suppress the double frequency (that is, the second harmonic) and/or the triple frequency (that is, the third harmonic) in the input signal Sin. In an embodiment, any conductor is excluded between the coil inductor L1 and the coil inductor L2, so that the coil inductor L1 and the coil inductor L2 have better mutual inductance.

Figure 7:
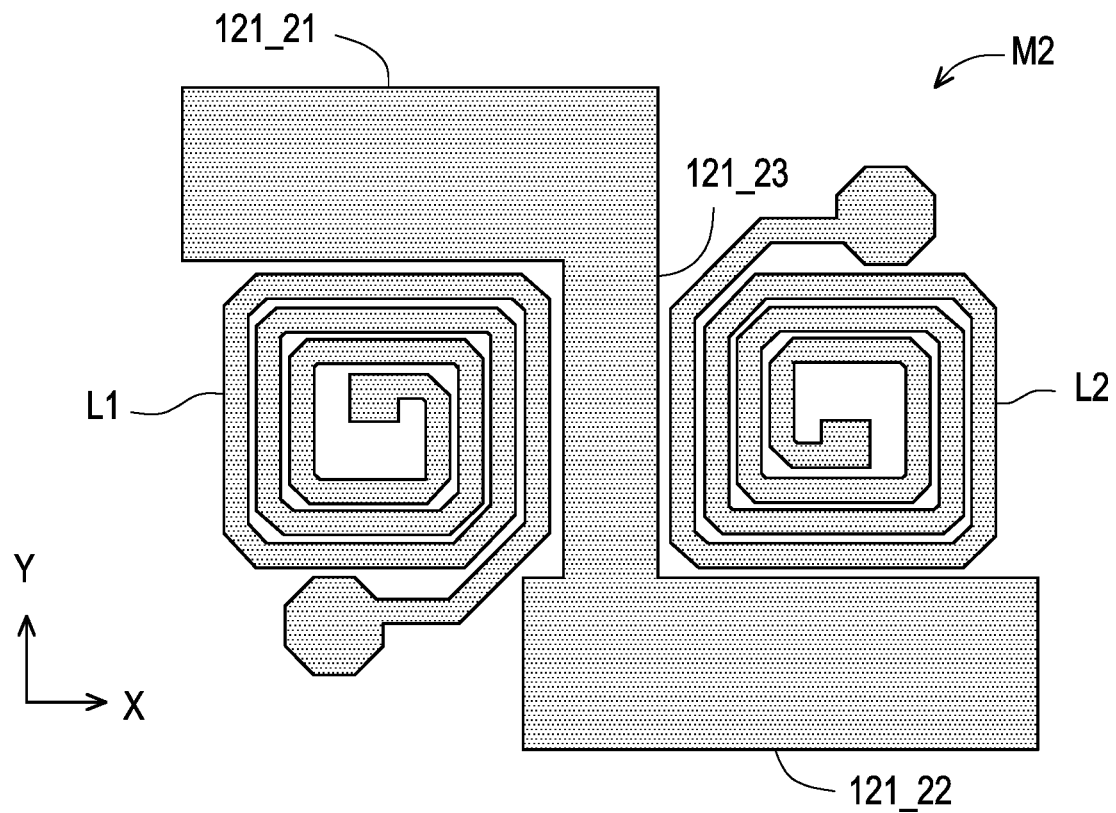
FIG. 7 is a schematic view of the layout structure of the second conductive layer shown in FIG. 4 according to another embodiment of the disclosure.

FIG. 7 is a schematic view of a layout structure of the second conductive layer M2 shown in FIG. 4 according to another embodiment of the disclosure. Please refer to FIG. 3, FIG. 4, FIG. 5, and FIG. 7. In the embodiment shown in FIG. 7, the matching circuit 121 further includes a conductive line 121_23. The reference voltage transmission element 121_21, the reference voltage transmission element 121_22, the conductive line 121_23, the coil inductor L1, and the coil inductor L2 of the matching circuit 121 are configured on the second conductive layer M2. Two terminals of the conductive line 121_23 are respectively electrically connected to the reference voltage transmission elements 121_21 and 121_22. That is, the conductive line 121_23 may be electrically connected to the pad Pref1 through the reference voltage transmission element 121_21 and may be electrically connected to the pad Pref2 through the reference voltage transmission element 121_22. The conductive line 121_23 is configured between the coil inductor L1 and the coil inductor L2. In the embodiment, although there is a conductor, that is, the conductive line 121_23, between the coil inductor L1 and the coil inductor L2, the shortest distance between the coil inductor L1 and the conductive line 121_23, the shortest distance between the coil inductor L2 and the conductive line 121_23, and/or the width of the conductive line 121_23 may still be appropriately adjusted, so that the coil inductor L1 may form mutual inductance with the coil inductor L2 through the conductive line 121_23 and parasitic capacitance is formed, so as to jointly generate the transmission zero point located in the triple fundamental frequency range of the input signal Sin with the acoustic wave filter chip 110, especially the transmission zero point located at the double frequency and/or the triple frequency, to suppress the double frequency (that is, the second harmonic) and/or the triple frequency (that is, the third harmonic) in the input signal Sin. For example, the coil inductor L1 includes a spiral-shaped first conductive line, and the coil inductor L2 includes a spiral-shaped second conductive line. The first conductive line has a first line width, and the second conductive line has a second line width. The shortest distance between the coil inductor L1 and the conductive line 121_23 and the shortest distance between the coil inductor L2 and the conductive line 121_23 are respectively less than 4 times the first line width and 4 times the second line width.

In the above embodiments, the coil inductor L1 and the coil inductor L2 are placed on the same conductive layer. In any case, the implementation of the matching circuit is not limited thereto. For example, in other embodiments, the coil inductor L1 and the coil inductor L2 may be disposed on different conductive layers without overlapping with each other.

Figure 8:
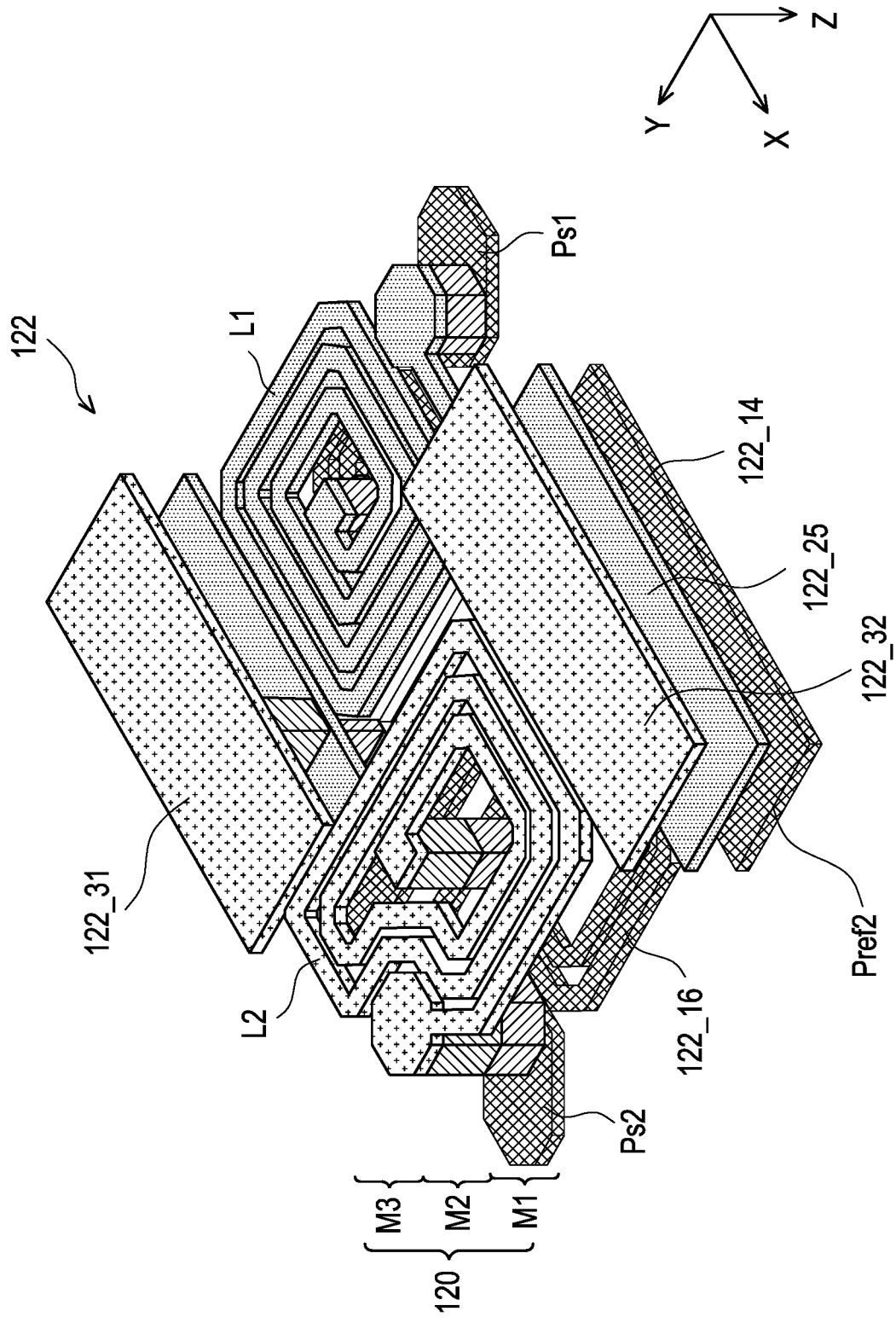
FIG. 8 is a three-dimensional perspective schematic view of the substrate shown in FIG. 1 according to another embodiment of the disclosure.

FIG. 8 is a three-dimensional perspective schematic view of the substrate 120 shown in FIG. 1 according to another embodiment of the disclosure. For an X-axis, a Y-axis, and a Z-axis shown in FIG. 8, reference may be made to the X-axis, the Y-axis, and the Z-axis shown in FIG. 1. The substrate 120 shown in FIG. 8 includes the first conductive layer M1, the second conductive layer M2, and a third conductive layer M3. Please refer to FIG. 1, FIG. 3, and FIG. 8. The second conductive layer M2 is disposed between the first conductive layer M1 and the third conductive layer M3. The third conductive layer M3 is disposed between the second conductive layer M2 and the acoustic wave filter chip 110. It should be noted that the first conductive layer M1, the second conductive layer M2, and the third conductive layer M3 shown in FIG. 8 are one specific example of many implementations of the substrate 120. In any case, the implementation of the substrate 120 should not be limited to the embodiment shown in FIG. 8.

In the embodiment shown in FIG. 8, a matching circuit 122 is disposed on the first conductive layer M1, the second conductive layer M2, and the third conductive layer M3 of the substrate 120. The matching circuit 122 may provide matching impedance to the acoustic wave filter chip 110. The pad Ps1 and the pad Ps2 are disposed on the first conductive layer M1 of the substrate 120. The pad Ps1 is electrically connected to one of the first signal terminal Ns1 and the second signal terminal Ns2 of the acoustic wave filter chip 110, and the pad Ps2 is electrically connected to the other one of the first signal terminal Ns1 and the second signal terminal Ns2 of the acoustic wave filter chip 110. For example, the pad Ps1 may be electrically connected to the first signal terminal Ns1 of the acoustic wave filter chip 110 through a conductive via, and the pad Ps2 may be electrically connected to the second signal terminal Ns2 of the acoustic wave filter chip 110 through a conductive via.

Figure 9:
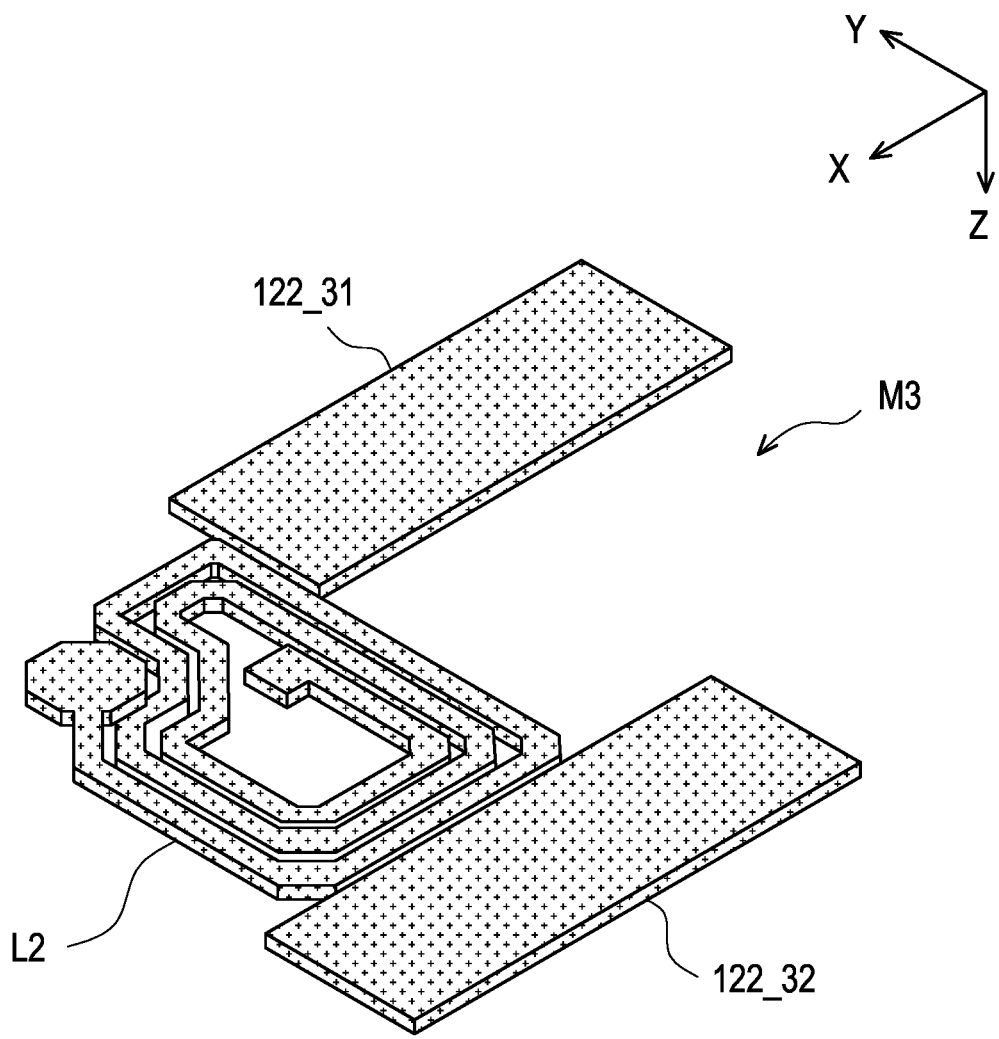
FIG. 9 is a schematic view of a layout structure of a third conductive layer M3 shown in FIG. 8 according to an embodiment of the disclosure.
Figure 10:
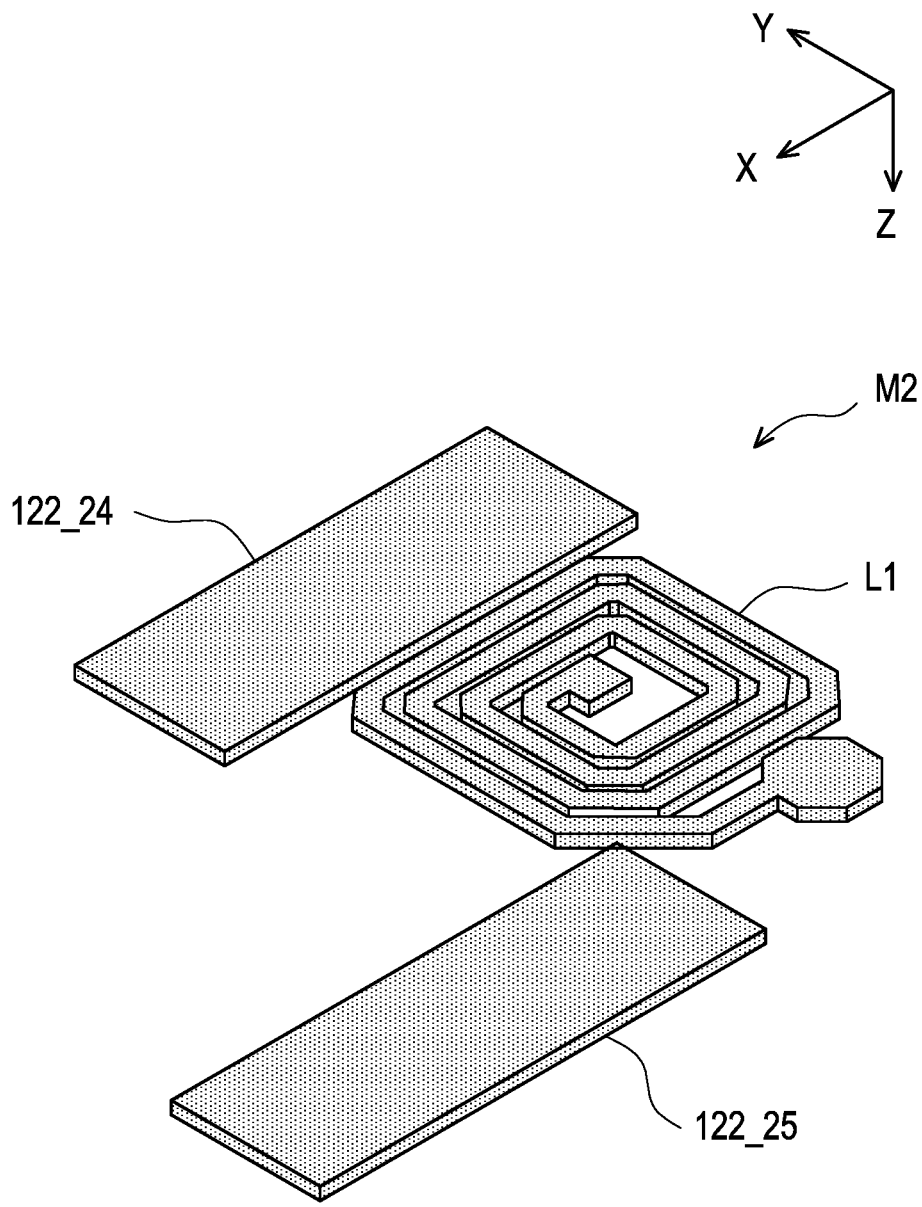
FIG. 10 is a schematic view of a layout structure of a second conductive layer M2 shown in FIG. 8 according to an embodiment of the disclosure.
Figure 11:
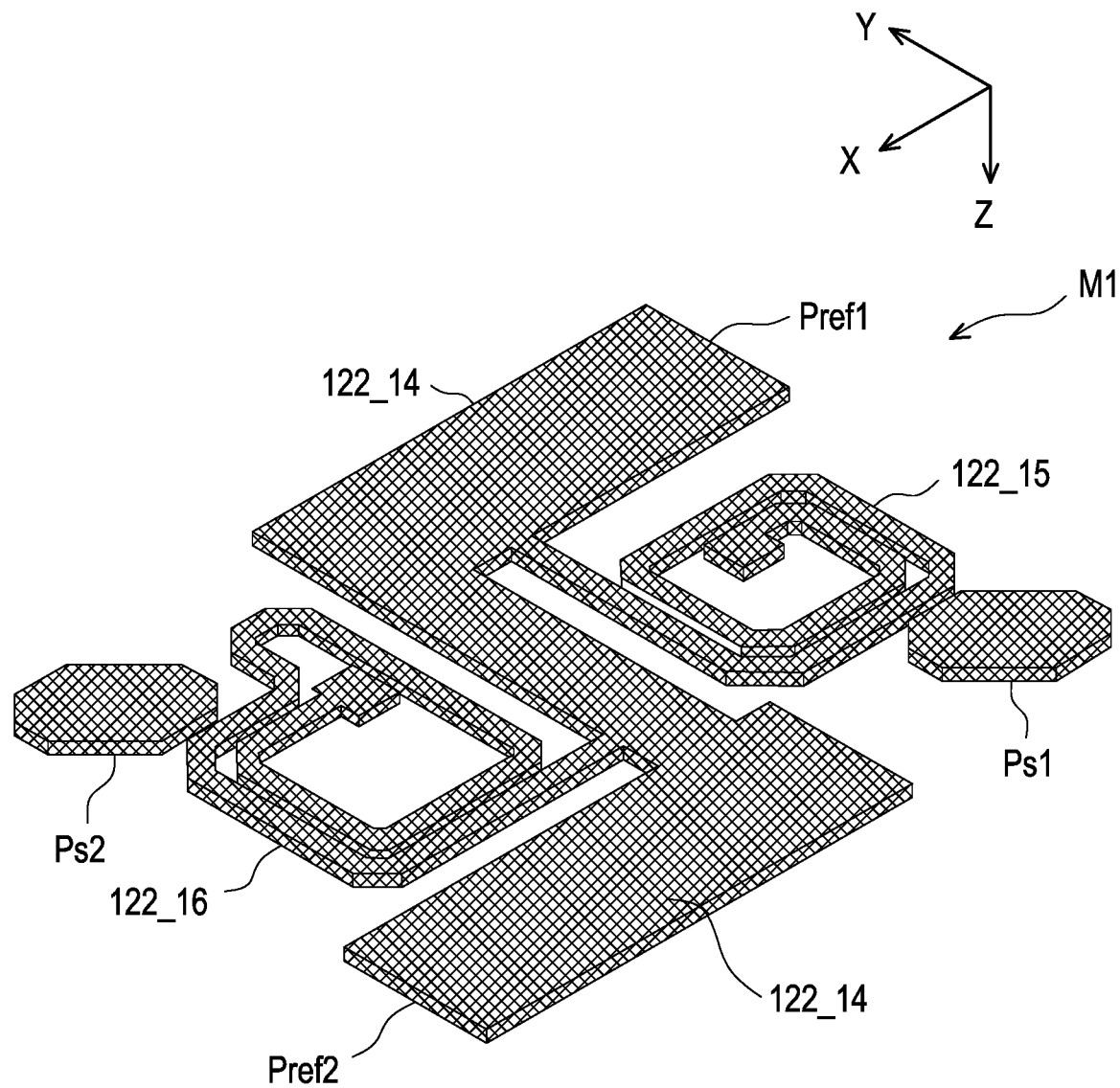
FIG. 11 is a schematic view of a layout structure of a first conductive layer M1 shown in FIG. 8 according to an embodiment of the disclosure.

FIG. 9 is a schematic view of a layout structure of the third conductive layer M3 shown in FIG. 8 according to an embodiment of the disclosure. FIG. 10 is a schematic view of a layout structure of the second conductive layer M2 shown in FIG. 8 according to an embodiment of the disclosure. FIG. 11 is a schematic view of a layout structure of the first conductive layer M1 shown in FIG. 8 according to an embodiment of the disclosure. Please refer to FIG. 3, FIG. 8, FIG. 9, FIG. 10, and FIG. 11. The matching circuit 122 includes the pad Ps1, the pad Ps2, the pad Pref1, the pad Pref2, the coil inductor L1, and the coil inductor L2. For the matching circuit 122, the pad Ps1, the pad Ps2, the pad Pref1, the pad Pref2, the coil inductor L1, and the coil inductor L2 shown in FIG. 8 to FIG. 11, reference may be made to the related descriptions of the matching circuit 121, the pad Ps1, the pad Ps2, the pad Pref1, the pad Pref2, the coil inductor L1, and the coil inductor L2 shown in FIG. 4 to FIG. 7, so there will be no repetition.

In the embodiment shown in FIG. 8 to FIG. 11, the coil inductor L1 is configured on the second conductive layer M2 of the substrate 120, and the coil inductor L2 is configured on the third conductive layer M3 of the substrate 120. The first terminal of the coil inductor L1 is electrically connected to the pad Ps1 of the substrate 120 through a conductive via. The first terminal of the coil inductor L2 is electrically connected to the pad Ps2 of the substrate 120 through a conductive via. The coil inductor L1 and the coil inductor L2 are disposed on different conductive layers M2 and M3 without overlapping with each other. The coil inductor L1 is adjacent to the coil inductor L2, so that mutual inductance and parasitic capacitance are formed, so as to jointly generate the transmission zero point located in the triple fundamental frequency range of the input signal Sin with the acoustic wave filter chip 110, especially the transmission zero point located at the double frequency and/or the triple frequency, to suppress the double frequency (that is, the second harmonic) and/or the triple frequency (that is, the third harmonic) in the input signal Sin.

A reference voltage transmission element 122_31, a reference voltage transmission element 122_32, and the coil inductor L2 of the matching circuit 122 are configured on the third conductive layer M3. A reference voltage transmission element 122_24, a reference voltage transmission element 122_25, and the coil inductor L1 of the matching circuit 122 are configured on the second conductive layer M2. A reference voltage transmission element 122_14, an adjustment coil 122_15, and an adjustment coil 122_16 of the matching circuit 122 are configured on the first conductive layer M1. The reference voltage transmission element 122_14 is electrically connected to the pad Pref1 and the pad Pref2. The reference voltage transmission element 122_14 is also electrically connected to the reference voltage transmission elements 122_24 and 122_25 through conductive vias (not shown). The reference voltage transmission elements 122_24 and 122_25 are electrically connected to the reference voltage transmission elements 122_31 and 122_32 through conductive vias (not shown). The reference voltage transmission elements 122_31 and 122_32 are electrically connected to the reference voltage terminals Nref1 to Nref3 of the acoustic wave filter chip 110. Therefore, the reference voltage Vref may be transmitted to the reference voltage terminals Nref1 to Nref3 of the acoustic wave filter chip 110 through the pad Pref1 and the pad Pref2.

The first terminal of the coil inductor L1 may be electrically connected to the pad Ps1 and the first signal terminal Ns1 of the acoustic wave filter chip 110 through conductive vias. The adjustment coil 122_15 is disposed corresponding to the coil inductor L1. A first terminal of the adjustment coil 122_15 may be electrically connected to the second terminal of the coil inductor L1 through a conductive via. A second terminal of the adjustment coil 122_15 is electrically connected to the reference voltage transmission element 122_14. The number of turns of the adjustment coil 122_15 is less than the number of turns of the coil inductor L1. The first terminal of the coil inductor L2 may be electrically connected to the pad Ps2 and the second signal terminal Ns2 of the acoustic wave filter chip 110 through conductive vias. The adjustment coil 122_16 is disposed corresponding to the coil inductor L2. A first terminal of the adjustment coil 122_16 may be electrically connected to the second terminal of the coil inductor L2 through a conductive via. A second terminal of the whole coil 122_16 is electrically connected to the reference voltage transmission element 122_14. The number of turns of the adjustment coil 122_16 is less than the number of turns of the coil inductor L2.

In the embodiment shown in FIG. 8 to FIG. 11, the coil inductor L1 includes a spiral-shaped first conductive line, and the coil inductor L2 includes a spiral-shaped second conductive line. The first conductive line has a first line width, and the second conductive line has a second line width. The shortest distance between the coil inductor L1 and the coil inductor L2 is less than 4 times the first line width (or the second line width). The first conductive line located on the outermost side of the coil inductor L1 and the second conductive line located on the outermost side of the coil inductor L2 are parallel to each other. Any conductor is excluded between the coil inductor L1 and the coil inductor L2. The coil inductor L1 is adjacent to the coil inductor L2, so that mutual inductance and parasitic capacitance are formed, so as to generate the transmission zero point located in the triple fundamental frequency range of the input signal Sin with the acoustic wave filter chip 110, especially the transmission zero point located at the double frequency and/or the triple frequency, to suppress the double frequency (that is, the second harmonic) and/or the triple frequency (that is, the third harmonic) in the input signal Sin.

In summary, the matching circuit 122 (or 121) described in the above embodiments may provide matching impedance to the acoustic wave filter chip 110. In the matching circuit 122 (or 121), the coil inductor L1 is adjacent to the coil inductor L2, so that mutual inductance and parasitic capacitance are formed, so additional configuration of some external elements (for example, capacitors, etc.) is not required. As such, the coil inductor L1, the coil inductor L2, and the acoustic wave filter chip 110 may jointly generate the transmission zero point located in the triple fundamental frequency range of the input signal Sin, especially the transmission zero point located at the double frequency and/or the triple frequency, to suppress the double frequency (that is, the second harmonic) and/or the triple frequency (that is, the third harmonic) in the input signal Sin.

Although the disclosure has been disclosed in the above embodiments, the embodiments are not intended to limit the disclosure. Persons skilled in the art may make some changes and modifications without departing from the spirit and scope of the disclosure. The protection scope of the disclosure shall be defined by the appended claims.

What is claimed is:

1. A filter integrated circuit, configured to filter an input signal and then output an output signal, comprising:
    an acoustic wave filter chip, covered upon a substrate to suppress signals outside a frequency band and having a first signal terminal and a second signal terminal that are respectively configured to input the input signal or output the output signal; and
    a matching circuit, disposed on the substrate to provide matching impedance to the acoustic wave filter chip, comprising:
        a first pad, configured on the substrate to electrically connect to the first signal terminal of the acoustic wave filter chip;
        a second pad, configured on the substrate to electrically connect to the second signal terminal of the acoustic wave filter chip, wherein the substrate comprises a first conductive layer, and the first pad and the second pad are disposed on the first conductive layer;
        a reference voltage transmission element, disposed on the first conductive layer and electrically connected to a first reference voltage terminal,
        a first coil inductor, configured on the substrate, wherein a first terminal of the first coil inductor is electrically connected to the first pad of the substrate; and
        a second coil inductor, configured on the substrate, wherein a first terminal of the second coil inductor is electrically connected to the second pad of the substrate,
        wherein the first coil inductor is adjacent to the second coil inductor, so that mutual inductance and parasitic capacitance are formed, so as to generate a transmission zero point located in a triple fundamental frequency range of the acoustic wave filter chip.

2. The filter integrated circuit according to claim 1, wherein the matching circuit further comprises a first adjustment coil and a second adjustment coil that are disposed on the first conductive layer and connected to the reference voltage transmission element, wherein the first adjustment coil and the second adjustment coil are respectively disposed corresponding to the first coil inductor and the second coil inductor.

3. The filter integrated circuit according to claim 2, wherein numbers of turns of the first adjustment coil and the second adjustment coil are respectively less than numbers of turns of the first coil inductor and the second coil inductor.

4. The filter integrated circuit according to claim 1, wherein the matching circuit further comprises a third pad disposed on the first conductive layer and electrically connected to the reference voltage transmission element and the first reference voltage terminal.

5. The filter integrated circuit according to claim 4, wherein the matching circuit further comprises a fourth pad disposed on the first conductive layer and electrically connected to the reference voltage transmission element and the first reference voltage terminal.

6. The filter integrated circuit according to claim 1, wherein the first coil inductor and the second coil inductor further respectively comprise spiral-shaped first conductive line and second conductive line.

7. A filter integrated circuit, configured to filter an input signal and then output an output signal, comprising:
an acoustic wave filter chip, covered upon a substrate to suppress signals outside a frequency band and having a first signal terminal and a second signal terminal that are respectively configured to input the input signal or output the output signal; and
a matching circuit, disposed on the substrate to provide matching impedance to the acoustic wave filter chip, comprising:
a first pad, configured on the substrate to electrically connect to the first signal terminal of the acoustic wave filter chip;
a second pad, configured on the substrate to electrically connect to the second signal terminal of the acoustic wave filter chip;
a first coil inductor, configured on the substrate, wherein a first terminal of the first coil inductor is electrically connected to the first pad of the substrate; and
a second coil inductor, configured on the substrate, wherein a first terminal of the second coil inductor is electrically connected to the second pad of the substrate,
wherein the first coil inductor is adjacent to the second coil inductor, so that mutual inductance and parasitic capacitance are formed, so as to generate a transmission zero point located in a triple fundamental frequency range of the acoustic wave filter chip,
wherein the first coil inductor and the second coil inductor respectively comprise a first conductive line and a second conductive line which are spiral-shaped,
wherein the first conductive line and the second conductive line respectively have a first line width and a second line width, wherein a shortest distance between the first coil inductor and the second coil inductor is less than 4 times the first line width or the second line width.

8. The filter integrated circuit according to claim 7, wherein the first conductive line and the second conductive line are respectively located at outermost sides of the first coil inductor and the second coil inductor.

9. The filter integrated circuit according to claim 8, wherein the first conductive line and the second conductive line are parallel to each other.

10. The filter integrated circuit according to claim 8, wherein the first coil inductor and the second coil inductor are disposed on a same conductive layer.

11. The filter integrated circuit according to claim 8, wherein the first coil inductor and the second coil inductor are disposed on different conductive layers without overlapping with each other.

12. The filter integrated circuit according to claim 7, wherein any conductor is excluded between the first coil inductor and the second coil inductor.

13. The filter integrated circuit according to claim 7, wherein the substrate further comprises a third conductive line disposed between the first coil inductor and the second coil inductor, and the first coil inductor forms mutual inductance with the second coil inductor through the third conductive line.

14. The filter integrated circuit according to claim 13, wherein the matching circuit further comprises a third pad electrically connected to a first reference voltage terminal, and the third conductive line is electrically connected to the third pad.

15. The filter integrated circuit according to claim 1, wherein the substrate further comprises a second conductive layer, and the first coil inductor and the second coil inductor are disposed on the second conductive layer.

16. The filter integrated circuit according to claim 15, wherein the second conductive layer is disposed between the first conductive layer and the acoustic wave filter chip.

17. The filter integrated circuit according to claim 1, wherein the substrate further comprises a second conductive layer and a third conductive layer, the first coil inductor is disposed on the second conductive layer, and the second coil inductor is disposed on the third conductive layer.

18. The filter integrated circuit according to claim 17, wherein the second conductive layer is disposed between the first conductive layer and the third conductive layer, and the third conductive layer is disposed between the second conductive layer and the acoustic wave filter chip.

* * * * *